(12) United States Patent
Seon et al.

(10) Patent No.: US 7,989,361 B2
(45) Date of Patent: Aug. 2, 2011

(54) COMPOSITION FOR DIELECTRIC THIN FILM, METAL OXIDE DIELECTRIC THIN FILM USING THE SAME AND PREPARATION METHOD THEREOF

(75) Inventors: Jong Baek Seon, Seoul (KR); Hyun Dam Jeong, Suwon-si (KR); Sang Yoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 925 days.

(21) Appl. No.: 11/831,380

(22) Filed: Jul. 31, 2007

(65) Prior Publication Data
US 2008/0079075 A1    Apr. 3, 2008

(30) Foreign Application Priority Data

Sep. 30, 2006 (KR) .................. 10-2006-0096650
May 17, 2007 (KR) .................. 10-2007-0048233

(51) Int. Cl.
*H01L 21/31* (2006.01)

(52) U.S. Cl. ... 438/781; 257/40; 257/310; 257/E51.007; 438/99; 438/780

(58) Field of Classification Search ............ 257/40, 257/310, E51.007; 438/99, 780, 781
See application file for complete search history.

(56) References Cited

U.S. PATENT DOCUMENTS

| | | | | |
|---|---|---|---|---|
| 6,344,242 | B1 * | 2/2002 | Stolk et al. | 427/301 |
| 2005/0277274 | A1 * | 12/2005 | Karkkainen | 438/496 |
| 2006/0079400 | A1 * | 4/2006 | Lobo et al. | 503/227 |
| 2008/0274037 | A1 * | 11/2008 | Gross et al. | 423/465 |

* cited by examiner

*Primary Examiner* — Ken A Parker
*Assistant Examiner* — Anthony Ho
(74) *Attorney, Agent, or Firm* — Cantor Colburn LLP (57) ABSTRACT

This invention pertains to a composition for a dielectric thin film, which is capable of being subjected to a low-temperature process. Specifically, the invention is directed to a metal oxide dielectric thin film formed using the composition, a preparation method thereof, a transistor device comprising the dielectric thin film, and an electronic device comprising the transistor device. The electronic device to which the dielectric thin film has been applied exhibits excellent electrical properties, thereby satisfying both a low operating voltage and a high charge mobility.

14 Claims, 5 Drawing Sheets

COMPOSITION FOR DIELECTRIC THIN FILM, METAL OXIDE DIELECTRIC THIN FILM USING THE SAME AND PREPARATION METHOD THEREOF

CROSS-REFERENCE TO RELATED APPLICATION

This non-provisional application claims priority under 35 U.S.C. §119 to Korean Patent Application No. 10-2006-0096650, filed on Sep. 30, 2006 and Korean Patent Application No. 10-2007-0048233, filed on May 17, 2007 with the Korean Intellectual Property Office (KIPO), the entire contents of which are herein incorporated by reference.

BACKGROUND OF THE INVENTION

1. Field of the Invention

The present invention relates generally, to a composition for a dielectric thin film, and specifically to a dielectric thin film comprising a metal oxide, and to a preparation method thereof. In particular, the present invention relates to a composition for a dielectric thin film, which is capable of being subjected to a low-temperature manufacturing process and which has a high dielectric constant (high-k). Also provided is a transistor device comprising the dielectric thin film, and an electronic device that in turn, comprises the transistor device, thereby exhibiting excellent electrical properties, such as, for example, a low operating voltage and a high charge mobility.

2. Description of the Related Art

In a flat display device, such as, for example, a liquid crystal display ("LCD") or an electroluminescent display (ELD), thin film transistors ("TFT") are used as switching devices for controlling the operation of pixels and as driving devices for driving the pixels. In addition, the application of TFTs to devices such as smart cards, or plastic chips for inventory tags, has also been considered.

The TFT comprises a gate insulating film consisting of a material having a high-k value. Such dielectric thin films having a high-k, are prepared through a vacuum deposition process, such as, for example, chemical vapor deposition ("CVD") and atomic layer deposition ("ALD"), or through a solution process which uses a hydrolytic sol-gel technique. However, because the vacuum deposition process is conducted under high-temperature and high-vacuum conditions, it utilizes expensive equipment. Consequently, the cost of vacuum deposition is very high. Thus, alternative methods have been investigated for their ability to produce dielectric thin films with high-k values. For example, over the last several years solution processes, such as, for example, the low-cost hydrolytic sol-gel process, have received considerable attention.

The hydrolytic sol-gel process is a technique that is used for hydrolyzing a metal alkoxide or a metal salt in solution to thus produce a sol, which is subsequently gelled through condensation. The sol-gel process is conducted in three steps: hydrolysis, alcohol-producing condensation, and water-producing condensation. During the water-producing condensation step, an oxide having a hydroxyl group is converted into the final oxide. This conversion procedure is conducted at high temperatures of about 400 to about 500° C. This high-temperature process, which is performed at temperatures greater than or equal to 400° C., has the undesirable side-effect of causing deformation and damage to a typical substrate.

SUMMARY OF THE INVENTION

In one embodiment, the present invention provides a composition for a dielectric thin film, which is capable of being subjected to a low-temperature manufacturing process and which has a high-k value.

In another embodiment, the present invention provides a metal oxide dielectric thin film, formed using the composition, and a preparation method thereof.

In yet another embodiment, the present invention provides a transistor device comprising the metal oxide dielectric thin film and an electronic device further comprising the transistor device, thereby exhibiting excellent electrical properties, such as, for example, a low operating voltage and a high charge mobility.

In accordance with one aspect, the present invention provides a composition for a dielectric thin film comprising: a metal halide, represented by Formula 1 below, as a metal oxide precursor; one or more selected from among a metal alkoxide and an ether compound; and an organic solvent:

$$M_aX_b \qquad \text{[Formula 1]}$$

wherein in Formula 1, M is a metal of Groups 1 to 14; X is a halogen element; a is an integer from 1 to 3; and b is an integer from 1 to 10.

In accordance with another aspect, the invention provides a method of preparing a metal oxide dielectric thin film comprising: (a) preparing a metal oxide precursor solution by dissolving a metal halide, as represented by Formula 1, and one or more selected from among a metal alkoxide and an ether compound, in an organic solvent, (b) applying the metal oxide precursor solution onto the surface of a substrate, and (c) thermally treating the substrate.

In accordance with yet another aspect, the invention provides a metal oxide dielectric thin film obtained using the method of preparation described above In accordance with still another aspect, the present invention provides a transistor device comprising the metal oxide dielectric thin film.

In accordance with a further aspect, the present invention provides an electronic device comprising the transistor device.

BRIEF DESCRIPTION OF THE DRAWINGS

The above and/or other aspects and advantages of the present invention will become apparent and more readily understood from the following detailed description, taken in conjunction with the accompanying drawings, in which.

DETAILED DESCRIPTION OF THE PREFERRED EMBODIMENTS

Hereinafter, various embodiments will be explained in more detail with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one embodiment, the present invention pertains to a composition for a dielectric thin film, comprising: a metal halide, represented by Formula 1 below, as a metal oxide precursor, one or more selected from among a metal alkoxide and an ether compound, and an organic solvent:

$$M_aX_b \quad \text{[Formula 1]}$$

wherein in Formula 1, M is a metal of Groups 1 to 14; X is a halogen element; a is an integer from 1 to 3; and b is an integer from 1 to 10.

When the composition for a dielectric thin film of the present invention is applied on a substrate and is then thermally treated, a dielectric thin film having a high-k is produced. The composition for the dielectric thin film is formed into a thin film through a non-hydrolytic sol-gel process, resulting in an advantageous method due to the low-temperature requirement for this type of process.

As such, the dielectric thin film may be applied as a next-generation high-capacity memory material or transistor gate insulating film material in place of silicon oxide.

In another embodiment, the metal of the metal precursor is classified into one of Groups 1 to 14, and may be used without limitation as long as the metal oxide is an insulator. Preferred examples of the metal include one or more from the group consisting of titanium (Ti), zirconium (Zr), hafnium (Hf), aluminum (Al), tantalum (Ta), silicon (Si).

The metal alkoxide of the composition for a dielectric thin film is represented by Formula 2.

$$M_a(OR_1)_n \quad \text{[Formula 2]}$$

In Formula 2, M is a metal of Groups 1 to 14; a is an integer from 1 to 3; $R_1$ is a hydrogen atom, a $C_{1-10}$ alkyl group, a $C_{3-10}$ cycloalkyl group, a $C_{6-15}$ aryl group, a $C_{2-30}$ acryloyl group, a $C_{1-10}$ acryloyloxy group, a $C_{1-10}$ epoxy-substituted alkyl group or cycloalkyl group, a $C_{1-10}$ vinyl group, a $C_{1-10}$ alkyl group, a $C_{1-10}$ epoxy group, or a $C_{1-10}$ alkoxy group; and n is an integer from 1 to 6.

In yet another embodiment, the ether compound is represented by Formula 3.

$$R_2OR_1 \quad \text{[Formula 3]}$$

In Formula 3, $R_1$ and $R_2$ are each independently a hydrogen atom, a $C_{1-10}$ alkyl group, a $C_{3-10}$ cycloalkyl group, a $C_{6-15}$ aryl group, a $C_{2-30}$ acryloyl group, a $C_{1-10}$ acryloyloxy group, a $C_{1-10}$ epoxy-substituted alkyl group or cycloalkyl group, a $C_{1-10}$ vinyl group, a $C_{1-10}$ allyl group, a $C_{1-10}$ epoxy group, or a $C_{1-10}$ alkoxy group.

In accordance with one aspect, any organic solvent may be used without limitation. Specific examples of organic solvents are one or more selected from the group consisting of an aliphatic hydrocarbon solvent, including hexane; an aromatic hydrocarbon solvent, including anisol, mesitylene or xylene; a ketone-based solvent, including methyl isobutyl ketone, 1-methyl-2-pyrrolidinone or acetone; an ether-based solvent, including di(propylene glycol)methyl ether, cyclohexanone, tetrahydrofuran or isopropyl ether; an acetate-based solvent, including ethyl acetate, butyl acetate or propylene glycol methyl ether acetate; an alcohol-based solvent, including alkoxy alcohol or butyl alcohol, an amide-based solvent, including dimethylacetamide or dimethylformamide, a silicon-based solvent; or the like, or a combination comprising one or more of the foregoing solvents. Preferably, the organic solvent comprises an alkoxy alcohol, for example, 2-methoxy ethanol, or an ether-based solvent, for example, di(propylene glycol)methyl ether.

The ratio of each of the components used in the preparation of a dielectric thin film may be appropriately determined according to the choice of those skilled in the art, and in consideration of the need. With regards to the solubility of the composition, the composition for a dielectric thin film preferably comprises about 0.1 to about 50 weight percent (wt %) of a metal halide, and about 0.1 to about 50 wt % of a metal alkoxide or ether compound, with the balance of the composition comprising an organic solvent. Preferably, the composition comprises about 1 to about 20 wt % of a metal halide, and about 1 to about 20 wt % of a metal alkoxide or ether compound, with the balance of the composition comprising an organic solvent.

In order to increase the solubility and storability of the composition for a dielectric thin film, one or more additives may be added, according to the judgment of those skilled in the art and within a range that does not inhibit the purpose of the present invention. Specific examples of additive include one or more selected from the group consisting of an organic binder, a photosensitive monomer, a photoinitiator, a viscosity controller, a storage stabilizer, a wetting agent, and a combination comprising one or more of the foregoing additives.

Any additive may be used without limitation, including an organic binder, a typical material known in the field of prior art electronic devices.

In accordance with another aspect, the present invention is directed to a method of preparing a metal oxide dielectric thin film using the above composition. A metal halide represented by Formula 1, and one or more selected from among a metal alkoxide and an ether compound, are first dissolved in an organic solvent, thus preparing a metal oxide precursor solution. The metal oxide precursor solution is then applied on a substrate, and the substrate is subsequently subjected to thermal treatment as is used for a sol-gel process, thereby obtaining a metal oxide thin film. In particular, the metal oxide thin film is formed through a non-hydrolytic sol-gel process.

In accordance with yet another aspect, the non-hydrolytic sol-gel process may be conducted through a reaction (an alkoxide route) between a metal halide and a metal alkoxide, as represented by Reaction 1 below:

$$M_aX_b + M_a(OR_1)_b \rightarrow 2M_aO_{b/2} + bR_1X$$ [Reaction 1]

In Reaction 1, M is a metal of Groups 1 to 14; $X_b$ is a halogen element; a is an integer of 1 to about 3; b is an integer of 1 to about 10; $R_1$ is a hydrogen atom, a $C_{1-10}$ alkyl group, a $C_{3-10}$ cycloalkyl group, a $C_{6-15}$ aryl group, a $C_{2-30}$ acryloyl group, a $C_{1-10}$ acryloyloxy group, a $C_{1-10}$ epoxy-substituted alkyl group or cycloalkyl group, a $C_{1-10}$ vinyl group, a $C_{1-10}$ allyl group, a $C_{1-10}$ epoxy group, or a $C_{1-10}$ alkoxy group; and n is an integer of 1 to about 6.

As represented in Reaction 1, the metal components of the metal halide and the metal alkoxide are represented as being the same as each other, however the metal components may also be different from each other. Further, the metal of the metal halide may consist of two or more metal elements.

In Reaction 1, the metal, which is classified into one of Groups 1 to 14, may be any metal so long as the metal oxide represented by Formula 1 is an insulator. Examples of preferred metals include one or more selected from the group consisting of titanium (Ti), zirconium (Zr), hafnium (Hf), aluminum (Al), tantalum (Ta), silicon (Si), and the like, and a combination comprising one or more of the foregoing metals.

As the halogen element, any halogen element, such as fluorine (F), chlorine (Cl), bromine (Br), astatine (As), and iodine (I), may be used without limitation. In particular, fluorine, chlorine, and bromine are preferred halogens.

In one embodiment, the non-hydrolytic sol-gel process may be conducted through a reaction (an ether route) between a metal halide and an ether compound, as represented by Reaction 2 below. In Reaction 2, the metal halide is reacted with the ether compound to produce a metal alkoxide, which is subsequently reacted with a metal halide, thereby forming a metal oxide.

$$M_aX_b + b/2 R_2OR_1 \rightarrow \tfrac{1}{2}Ma(OR_1)_b + b/2 R_2X_a + \tfrac{1}{2}M_aX_b$$ [Reaction 2]

$$\tfrac{1}{2}M_aX_b + \tfrac{1}{2}M_a(OR_1)_b \rightarrow M_aO_{b/2} + R_1X_b$$

In Reaction 2, M is a metal of Groups 1 to 14; $X_b$ is a halogen element; a is an integer of 1 to about 3; b is an integer of 1 to about 10; $R_1$ and $R_2$ are each independently a hydrogen atom, a $C_{1-10}$ alkyl group, a $C_{3-10}$ cycloalkyl group, a $C_{6-15}$ aryl group, a $C_{2-30}$ acryloyl group, a $C_{1-10}$ acryloyloxy group, a $C_{1-10}$ epoxy-substituted alkyl group or cycloalkyl group, a $C_{1-10}$ vinyl group, a $C_{1-10}$ allyl group, a $C_{1-10}$ epoxy group, or a $C_{1-10}$ alkoxy group; and n is an integer of 1 to about 6.

In Reaction 2, any metal may be used as the metal without limitation, as long as it belongs to at least one of the groups consisting of Groups 1 to 14. Specific examples of the metal include one or more selected from the groups consisting of titanium (Ti), zirconium (Zr), hafnium (Hf), aluminum (Al), tantalum (Ta), silicon (Si), and the like, and a combination comprising one or more of the foregoing metals. Hence, as a result of the non-hydrolytic sol-gel process, a dielectric thin film comprising $TiO_2$, $SiO_2$, $ZrO_2$, $HfO_2$, $Al_2O_3$, and $Ta_2O_3$ may be obtained.

Although the metal halide is reacted either with the metal alkoxide or with the ether compound as described above, it is possible to simultaneously react the metal halide with both the metal alkoxide and the ether compound.

A hydrolytic sol-gel process is unable to convert an oxide having a hydroxyl group (—OH) into a final oxide at a low temperature, but instead uses a high-temperature process at temperatures about 400 to about 500° C. Conversely, a hydroxyl group may be excluded during the reaction that occurs during the non-hydrolytic sol-gel process used in the present invention, thereby allowing for the use of a low-temperature process. The method of the present invention is described in detail below.

In the preparation of the metal precursor solution, a metal halide of Formula 1 and one or more selected from among a metal alkoxide and an ether compound, are dissolved in an organic solvent, thus preparing the metal precursor solution.

Subsequently, in the coating of the substrate, examples of the substrate include one or more of the group consisting of glass, a silicon wafer, polyethylene terephthalate, polycarbonate, polyethersulfone, polyethylene naphthalate, and a combination of one or more of the foregoing substrates.

The metal oxide precursor solution is applied to the substrate through a coating process. Specific examples of a suitable coating process include one or more from the group consisting of spin coating, dip coating, roll coating, screen coating, spray coating, spin casting, flow coating, screen printing, ink jetting, drop casting, and the like, and a combination comprising one or more of the foregoing coating processes. Preferable processes for coating include spin coating or ink jetting. In the case of a spin coating process, the spinning rate is preferably set within a range from about 100 to about 10,000 revolutions per minute (rpm).

During the thermal treatment of the substrate, the composition applied on the substrate is baked and then cured. Such a baking process is preferably performed at a temperature ranging from about 50° C. to about 250° C. for a period of time ranging from about 1 second to about 1 hour, in a nitrogen atmosphere, an ambient atmosphere, or a vacuum atmosphere. The curing process is preferably performed at a temperature ranging from about 100° C. to about 1,000° C. for a period of time ranging from about 10 minutes to about 3 hours in a nitrogen atmosphere, an ambient atmosphere, or a vacuum atmosphere.

As the result of such a thermal treatment, a thin film of metal oxide, represented by Formula 4 below, is obtained.

$$M_xO_y$$ [Formula 4]

In Formula 4, M is a metal of Groups 1 to 14; x is 1 or 2; and y is greater than or equal to 1 and less than or equal to about 10.

Preferred examples of such metal oxide include, but are not limited to, one or more selected from the group consisting of $TiO_2$, $SiO_2$, $ZrO_2$, $HfO_2$, $Al_2O_3$, $Ta_2O_5$, and the like, and a combination of one or more of the foregoing metal oxides.

In one embodiment, the thickness of the dielectric thin film of the present invention is not particularly limited, and is preferably set within a range of about 10 Angstroms (Å) to about 10,000 Å.

The dielectric thin film comprising a metal oxide is prepared through a non-hydrolytic sol-gel process and consequently an hydroxyl group may be excluded in the course of the reaction, allowing for the use of a low-temperature process. As well, the dielectric thin film exhibits the electrical properties of a material, which has a high-k. Accordingly, an electronic device comprising the dielectric thin film manifests excellent electrical properties, satisfying both a low operating voltage and a high charge mobility. Ultimately, the dielectric thin film of the present invention may be effectively applied to various electronic devices.

In another embodiment, the present invention pertains to a transistor device that comprises the above metal oxide dielectric thin film, and to an electronic device that further comprises the transistor device.

The transistor device may be used in a low-operating-voltage device capable of being subjected to a printing process, which is exemplified by a thin film transistor (TFT), and which comprises a substrate, a gate electrode, a gate insulating layer comprising the above dielectric thin film, a semiconductor layer, and source/drain electrodes.

In yet another embodiment, the structure of the TFT of is not particularly limited, and may be selected from one or more of the group consisting of a top contact structure, a bottom contact structure, and a top gate structure. Examples of the TFT structure that may be manufactured using the metal oxide dielectric thin, are schematically illustrated in FIGS. 1 and 2.

Figure 1:
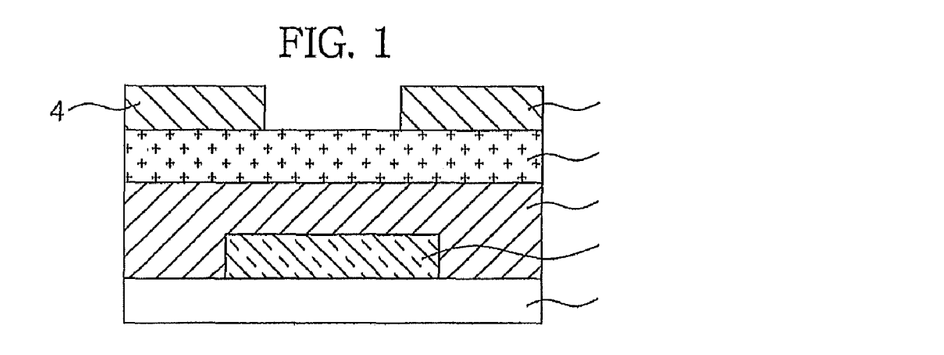
FIG. 1 is an exemplary schematic cross-sectional view illustrating the top contact type TFT.
Figure 2:
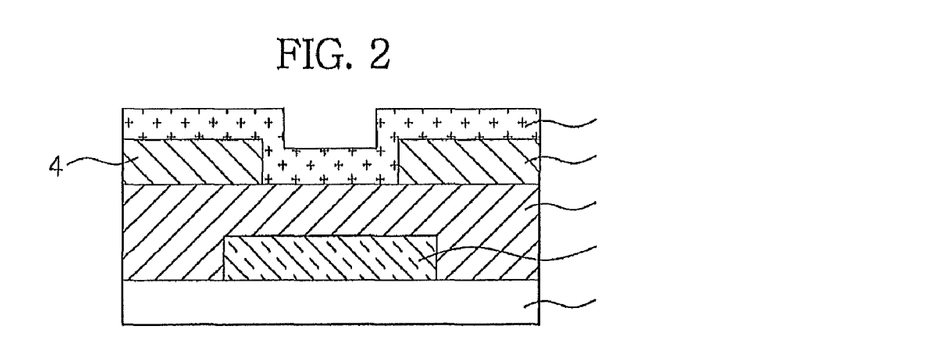
FIG. 2 is an exemplary schematic cross-sectional view illustrating the bottom contact type TFT

FIG. 1 is an exemplary schematic cross-sectional view illustrating the top contact type TFT, and FIG. 2 is an exemplary schematic cross-sectional view illustrating the bottom contact type TFT.

As illustrated in FIG. 1, the TFT of the present invention has a structure comprising a gate electrode 2, a gate insulating layer 3, a semiconductor layer 6, and source/drain electrodes 4 and 5, which are sequentially formed on a substrate 1. Alternatively, as illustrated in FIG. 2, the TFT of the present invention may have a structure comprising a gate electrode 2, a gate insulating layer 3, source/drain electrodes 4 and 5, and a semiconductor layer 6, which are sequentially formed on a substrate 1.

Examples of the TFT substrate 1 of the TFT include, but are not limited to, one or more selected from the group consisting of glass, a silicon wafer, polyethylene terephthalate, polycarbonate, polyethersulfone, and polyethylene naphthalate.

A typical metal or conductive polymer may be used as material for the gate electrode 2 and the source/drain electrodes 4 and 5. Specific examples of suitable metals include, but are not limited to, one or more selected from the group consisting of doped silicon or gold, silver, aluminum, copper, nickel, chromium, molybdenum, tungsten, indium tin oxide, and a combination of one or more of the foregoing metals.

The metal oxide dielectric thin film described herein is used as the gate insulating layer 3, and any typical organic and inorganic semiconductor material may be used for the semiconductor layer 6, without limitation. Specific examples of the organic semiconductor material include, but are not limited to, one or more selected from the group consisting of pentacene, copper phthalocyanine, polythiophene, polyaniline, polyacetylene, polypyrrole, polyphenylene vinylene, and derivatives thereof, and a combination of one or more of the foregoing organic semiconductor materials. Specific examples of the inorganic semiconductor material include, but are not limited to, one or more selected from the group consisting of silicon (Si), cadmium selenide (CdSe), cadmium sulfide (CdS), cadmium telluride (CdTe), zinc oxide (ZnO), tin dioxide ($SnO_2$), zinc sulfide (ZnS), and a combination of one or more of the foregoing inorganic semiconductor materials. Furthermore, any material may be used without limitation, as long as it has semiconductor properties.

In one embodiment, the transistor device may be applied to any electronic device, as long as the electronic device is a low-operating-voltage electronic device capable of being subjected to a printing process. Examples of electronic devices include, but are not limited to, one or more selected from the group consisting of a display device, a memory device (DRAM), a complementary metal-oxide semiconductor (CMOS) device, a photovoltaic device, an organic electroluminescent device (OLED), a sensor, an integrated circuit, and combinations of one or more of the foregoing electronic devices.

In another embodiment, the metal oxide dielectric thin film may be used as a capacitor dielectric layer for an information storing memory device or CMOS device or, as a TFT dielectric layer of the display device.

Hereinafter, exemplary embodiments of the present invention will be described in detail with reference to the following examples. However, these examples are given for the purpose of illustration and are not intended to limit the present invention.

EXAMPLES

Preparative Example 1

Preparation of a Composition for a Dielectric Thin Film (1)

A precursor mixture, comprising 1 mol of zirconium tetrachloride ($ZrCl_4$) and 1 mol of a zirconium (4) isopropoxide-isopropanol complex ($Zr(OiPr)_4(iPrOH)$), was dissolved in 2-methoxy ethanol, to thus obtain a zirconium oxide composition containing 5 wt % of the precursor mixture.

Preparative Example 2

Preparation of a Composition for a Dielectric Thin Film (2)

A zirconium oxide composition was prepared in the same manner as in Preparative Example 1, with the exception that the amount of the precursor mixture was 15 wt %.

Example 1

Preparation of a Zirconium Oxide Dielectric Thin Film (1)

The composition prepared in Preparative Example 1, was applied onto a silicon wafer at room temperature through spin coating at 500 rpm for 30 seconds (sec). The composition was thermally treated at 100° C. for 1 min and then at 300° C. for 1 hour, in an ambient atmosphere, thus preparing a zirconium oxide ($ZrO_2$) dielectric thin film with a thickness of about 416 Å.

Example 2

Preparation of Zirconium Oxide Dielectric Thin Film (2)

A zirconium oxide dielectric thin film with a thickness of about 338 Å, was prepared in the same manner as in Example 1, with the exception that the thermal treatment was conducted at 100° C. for 1 min, at 200° C. for 5 min, and then at 400° C. for 30 min, in an ambient atmosphere.

Example 3

Preparation of a Zirconium Oxide Dielectric Thin Film (3)

A zirconium oxide dielectric thin film was prepared in the same manner as in Example 1, with the exception that the thermal treatment was conducted at 100° C. for 1 min, and then at 300° C. for 5 min, in a nitrogen atmosphere.

Example 4

Preparation of a Zirconium Oxide Dielectric Thin Film (4)

A zirconium oxide dielectric thin film was prepared in the same manner as in Example 1, with the exception that the thermal treatment was conducted at 100° C. for 1 min, and then at 300° C. for 10 min, in a nitrogen atmosphere.

Example 5

Preparation of a Zirconium Oxide Dielectric Thin Film (5)

A zirconium oxide dielectric thin film was prepared in the same manner as in Example 1, with the exception that the thermal treatment was conducted at 100° C. for 1 min, and then at 300° C. for 3 hours, in a nitrogen atmosphere.

Example 6

Preparation of a Zirconium Oxide Dielectric Thin Film (6)

A zirconium oxide dielectric thin film was prepared in the same manner as in Example 1, with the exception that the thermal treatment was conducted at 100° C. for 1 min, and then at 300° C. for 1 hour, in a nitrogen atmosphere.

Example 7

Manufacture of a TFT (1)

The zirconium oxide composition prepared in Preparative Example 2 was applied onto an n-doped silicon wafer, serving as a gate electrode, through spin coating, thus forming a film. Subsequently, thermal treatment was performed at 100° C. for 1 min in a nitrogen atmosphere to thus remove the solvent, after which thermal treatment for curing was performed at 300° C. for 1 hour, thereby forming a gate insulating layer with a thickness of about 1500 Å.

Figure 3:
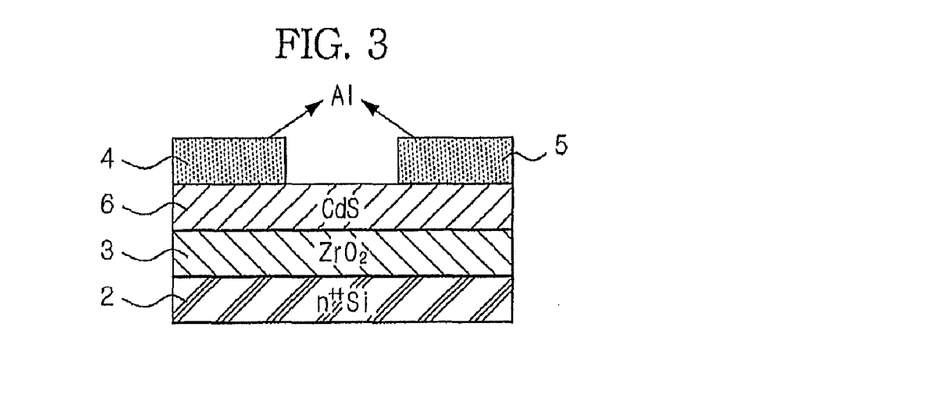
FIG. 3 is a schematic cross-sectional view illustrating the top contact type TFT of Example 7.

A semiconductor layer, comprising a cadmium sulfide (CdS) thin film, was formed to a thickness of about 500 Å on the gate insulating layer using a spin coating process. Aluminum (Al) source/drain electrodes having a channel length of 20 micrometers (μm) and a channel width of 2 millimeters (mm), were formed on the semi-conductor layer through a lift-off process using photolithography, thereby manufacturing the top contact type TFT illustrated in FIG. 3.

Example 8

Manufacture of a TFT (2)

An alloy of tungsten/molybdenum (W/Mo) was deposited on a glass substrate to form a gate electrode of about 2000 Å in thickness, and the zirconium oxide composition prepared in Preparative Example 2 was applied thereon through spin coating, thereby forming a film. Thermal treatment was performed at 100° C. for 1 min in a nitrogen atmosphere to remove the solvent, and then thermal treatment for curing was performed at 300° C. for 1 hour, thereby obtaining a gate insulating layer of about 1500 Å in thickness.

Figure 4:
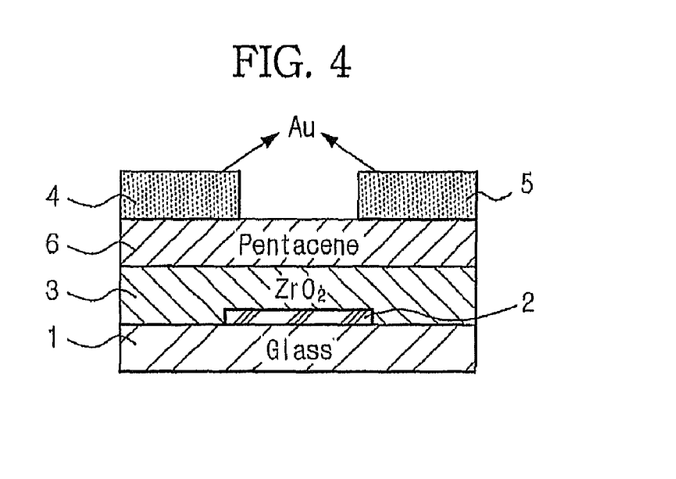
FIG. 4 is a schematic cross-sectional view illustrating the top contact type TFT of Example 8.

As a semiconductor layer, a pentacene layer of about 700 Å in thickness was formed on the gate insulating layer using a thermal evaporation process. Gold (Au) source/drain electrodes were subsequently formed on the semiconductor layer through vacuum deposition using a shadow mask having a channel length of about 160 μm and a channel width of about 1 mm, thereby manufacturing the top contact type TFT illustrated in FIG. 4.

Comparative Example 1

Manufacture of a TFT

A top contact type TFT was manufactured in the same manner as in Example 7, with the exception that a gate insulating layer was formed to a thickness of about 3,000 Å using silicon oxide ($SiO_2$) deposited through plasma enhanced chemical vapor deposition (PECVD).

Experimental Example 1

Analysis of a Thin Film Composition

In order to determine whether or not an hydroxyl group was present in the metal oxide dielectric thin film, the thin film compositions prepared in Examples 3, 4, 5 and 6, in which the final curing temperature was 300° C., were analyzed using an Fourier Transform Infrared (FTIR) analyzer. The results are shown in FIG. 5.

Figure 5:
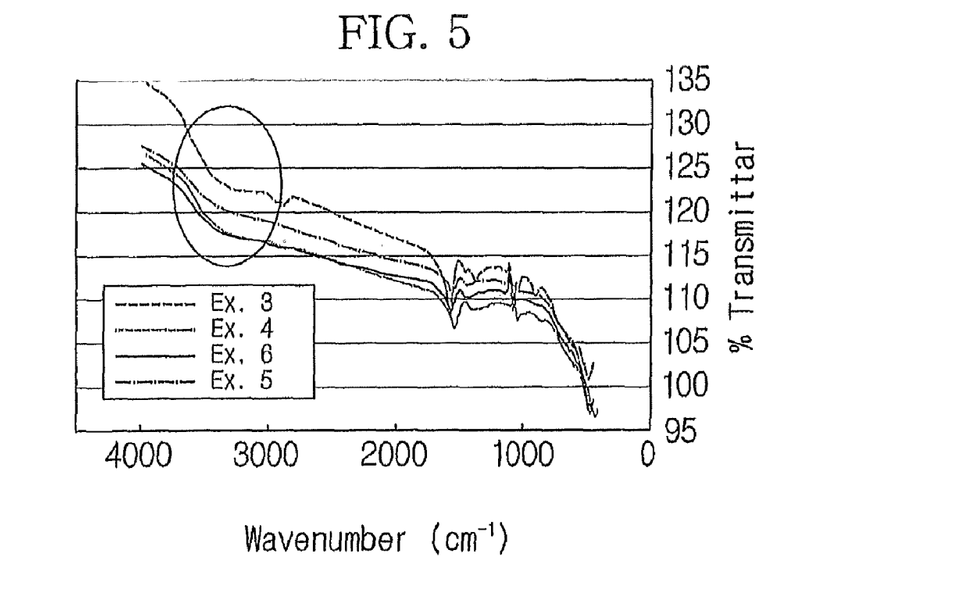
FIG. 5 is a graph illustrating the analysis results of the dielectric thin film compositions of Examples 3 to 6.

As illustrated in FIG. 5, broad peaks were observed due to the presence of the hydroxyl group near a wavenumber of about 3500 $cm^{-1}$, regardless of the curing time. However, in the case where the curing time was 3 hours (Example 5), the magnitude of the peak was significantly decreased to about 3500 $cm^{-1}$, so that the peak almost disappeared. From these results, it was confirmed that the low-temperature process at 300° C. was an effective method of thermal treatment.

Experimental Example 2

Measurement of the Electrical Properties of a Thin Film

The electrical properties of a metal oxide dielectric thin film was measured, including the leakage current and the dielectric constant.

Figure 6:
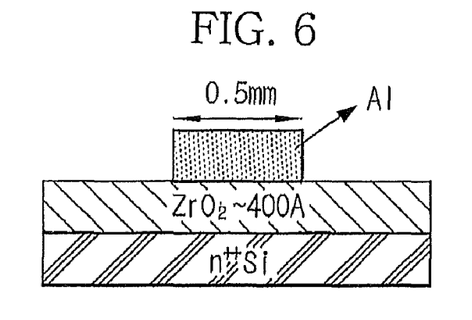
FIG. 6 is a schematic cross-sectional view illustrating the device for measuring the electrical properties of the dielectric thin film of Experimental Example 2.

The zirconium oxide composition prepared in Preparative Example 1, was applied on an n-type silicon wafer doped with arsenic (As) through spin coating, and then thermally treated at 100° C. for 1 min, followed by 300° C. for 30 min, to thus form an insulating layer of about 400 Å in thickness. Thereafter, an aluminum (Al) thin film of about 1500 Å thick, was deposited thereon through e-beam evaporation in order to form an upper electrode, and thereby manufacturing the device for measuring electrical properties illustrated in FIG. 6.

Figure 7:
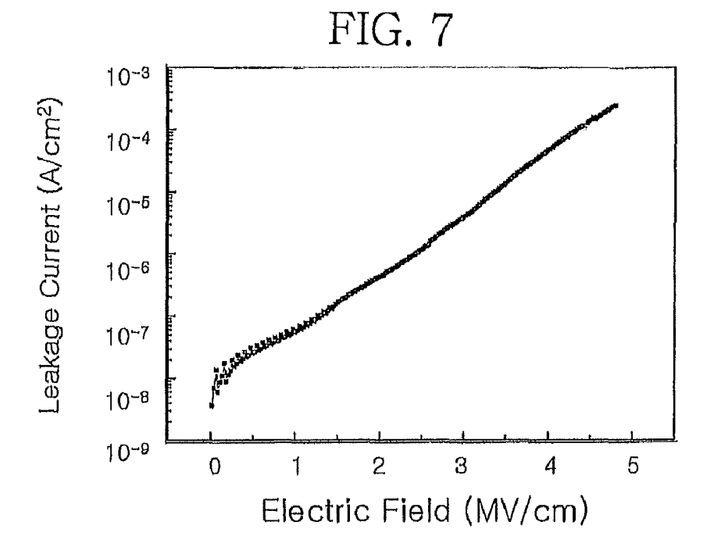
FIG. 7 is a graph illustrating the results obtained from measuring the electrical properties of the device depicted in FIG. 6.

Using the device thus manufactured, the leakage current, the dielectric constant, and the breakdown voltage were measured. The results are shown in FIG. 7. In FIG. 7, the leakage current was determined from the amount of current flowing per unit area when the electrical field was 1 MV/cm.

The dielectric constant was calculated by substituting capacitance, measured at a frequency of about 100 kHz using a precision LCR meter (HP4284A) provided with a probe station (Micromanipulator 6200 probe station), and the thickness of the thin film, measured using a spectroscopic ellipsometer, into Equation 1.

$$k = C \times d / \in_0 \times A \qquad \text{[Equation 1]}$$

In Equation 1, k is the dielectric constant, C is the capacitance, d is the thickness of the low dielectric thin film, $\in_0$ is the dielectric constant in a vacuum, and A is the contact sectional area of the electrode.

As illustrated in FIG. 7, when the curing process was at about 300° C., the off-state leakage current was about $5 \times 10^{-8}$ A/cm$^2$ or less. Further, no breakdown was observed at values less than about 4.8 MV/cm, and thus the breakdown voltage was determined to be 4.8 MV/cm or higher. The dielectric constant, calculated using the above equation, was about 11. Therefore, it could be seen that excellent dielectric properties and a high-k value were achieved by using the low-temperature process at about 300° C.

Experimental Example 3

Evaluation of the Electrical Properties of a TFT (1)

The operating properties of the TFTs manufactured in Example 7 and Comparative Example 1, including threshold voltage, charge mobility and operating voltage, were measured using a semiconductor analyzer (4200-SCS; Keithley) in order to determine the electrical properties of the TFTs.

The charge mobility was calculated using the following current equation set for the saturation region (Equation Set 1). That is, the current equation for the saturation region was converted into a graph of $(I_{SD})^{1/2}$ and $V_G$, and the charge mobility was calculated from the slope of the converted graph.

$$I_{SD} = \frac{WC_0}{2L} \mu (V_G - V_T)^2 \qquad \text{[Equation Set 1]}$$

$$\sqrt{I_{SD}} = \sqrt{\frac{\mu C_0 W}{2L}} (V_G - V_T)$$

$$\text{slope} = \sqrt{\frac{\mu C_0 W}{2L}}$$

$$\mu_{FET} = (\text{slope})^2 \frac{2L}{C_0 W}$$

In Equation Set 1, $I_{SD}$ is the source-drain current, μ or $\mu_{FET}$ is the charge mobility, $C_o$ is the oxide film capacitance, W is the channel width, L is the channel length, $V_G$ is the gate voltage, and $V_T$ is the threshold voltage.

The threshold voltage was determined to be the intersection between the $V_G$ axis and the extrapolated linear region of the graph of $(I_{SD})^{1/2}$ and $V_G$. When the absolute value of the threshold voltage is close to 0, less power is consumed.

Figure 8A:
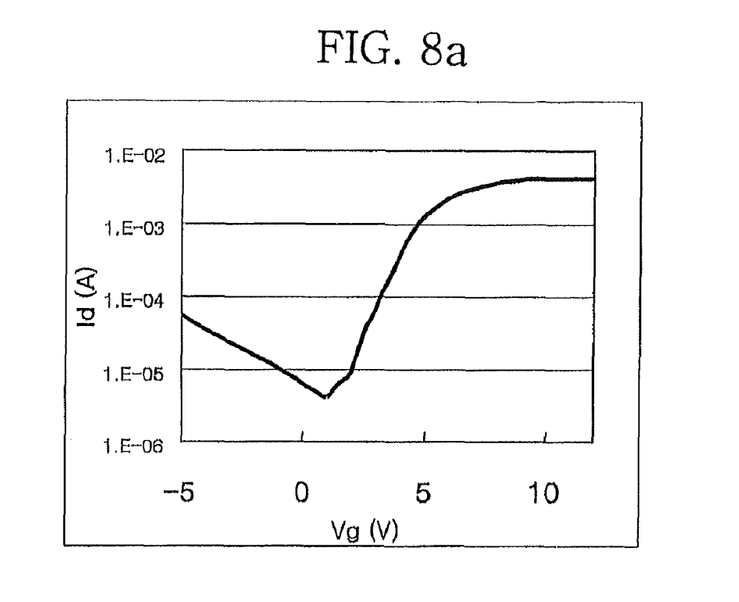
FIGS. 8A and 8B are graphs illustrating the results obtained from measuring the electrical properties of the TFTs of Example 6 and Comparative Example 1, respectively.

FIG. 8A illustrates the operating properties of the TFT manufactured in Example 7, comprising zirconium oxide as the gate insulating layer and CdS as the semiconductor layer. FIG. 9B illustrates the operating properties of the conventional TFT manufactured in Comparative Example 1 comprising SiO$_2$ as the gate insulating layer applied through PECVD.

Figure 8B:
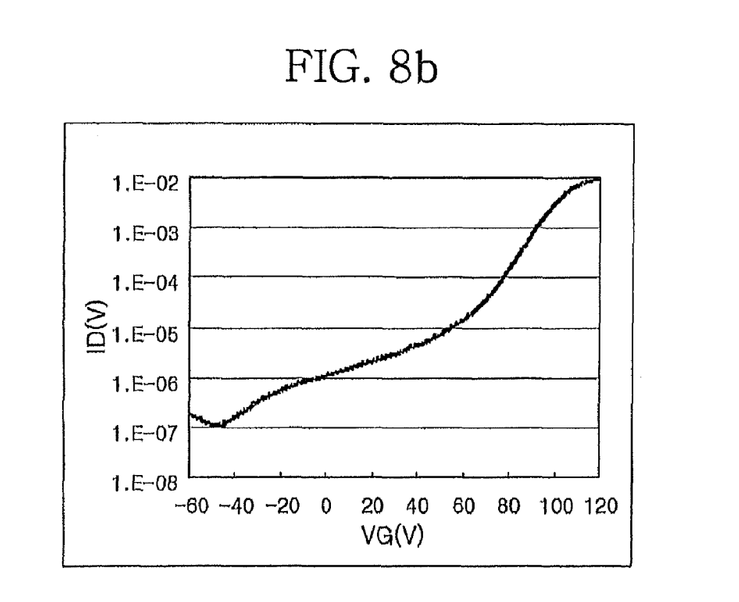

As illustrated in FIGS. 8A and 8B, the TFT of Example 7 had a threshold voltage of about 2 V or less, which was much lower than the about 80 V or less which was obtained for the prior art TFT of Comparative Example 1. Further, the charge mobility of Example 7 was determined to be about 37.9 cm$^2$/VS or less, which was superior to the charge mobility of the prior art TFT, and even further, the operating voltage thereof was also drastically decreased.

Experimental Example 4

Measurement of the Electrical Properties of a TFT (2)

The operating properties of the TFT manufactured in Example 8, including threshold voltage, charge mobility and $I_{on}/I_{off}$ ratio, were measured as described in Experimental Example 3.

The $I_{on}/I_{off}$ ratio was the ratio of the maximum current in the on-state to the minimum current in the off-state. The $I_{on}/I_{off}$ ratio is represented by Equation 2.

$$\frac{I_{on}}{I_{off}} = \left(\frac{\mu}{\sigma}\right) \frac{C_0^2}{q N_A t^2} V_D^2 \qquad \text{[Equation 2]}$$

In Equation 2, $I_{on}$ is the maximum current, $I_{off}$ is the off-state leakage current, μ is the charge mobility, σ is the conductivity of the thin film, q is the quantity of the electric charge, $N_A$ is the density of the electric charge, t is the thickness of the semiconductor film, $C_o$ is the oxide film capacitance, and $V_D$ is the drain voltage.

Figure 9A:
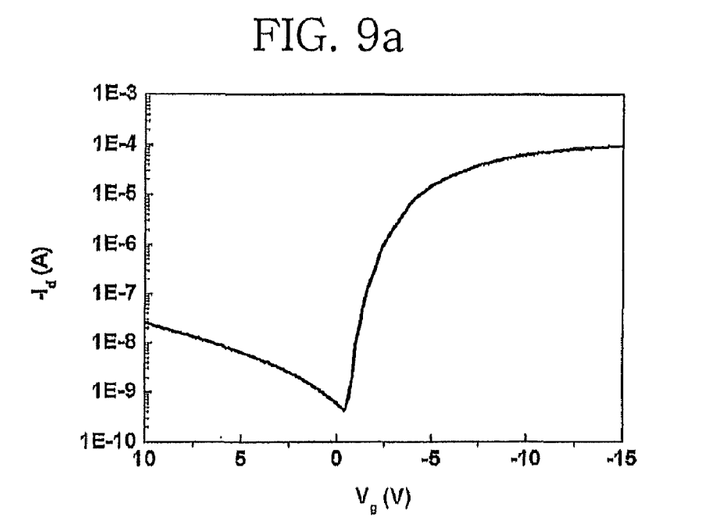
FIGS. 9A and 9B are graphs illustrating the results obtained from measuring the electrical properties of the TFT of Example 8.
Figure 9B:
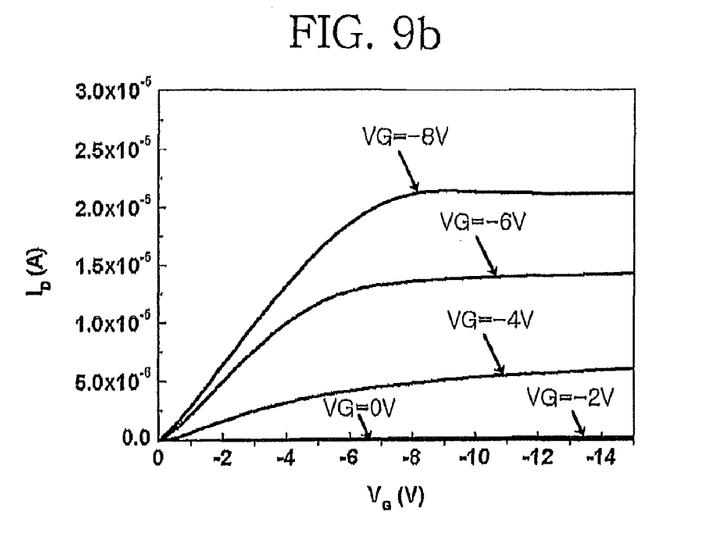

FIGS. 9A and 9B illustrate the operating properties of the TFT manufactured in Example 8 comprising zirconium oxide as the gate insulating layer and pentacene as the semiconductor layer.

As illustrated in FIGS. 9A and 9B, the threshold voltage was about −1.8 V or less, the $I_{on}/I_{off}$ ratio was about 2.14×10$^5$ or less, and the charge mobility was about 7.6 cm$^2$/VS or less. Consequently, the TFT comprising the dielectric thin film having a high-k value, was able to achieve a low operating voltage and a high charge mobility.

According to one embodiment, the method of preparing the metal oxide dielectric thin film may also be applied to the preparation of a composite metal oxide thin film that comprises two or more metal elements.

As described herein, the present invention provides a composition for a dielectric thin film, specifically, a metal oxide dielectric thin film, and a preparation method thereof. According to another embodiment, the composition for a dielectric thin film may be formed into a thin film through a non-hydrolytic sol-gel process. As such, the dielectric thin film may be formed through a low-temperature process thereby decreasing the manufacturing cost. In addition, when the dielectric thin film, comprising a low leakage current and a high-k is applied to an electronic device, the electronic device may exhibit excellent electrical properties, satisfying both a low operating voltage and a high charge mobility.

Although the preferred embodiments of the present invention have been disclosed for illustrative purposes, the present invention is not limited to the described exemplary embodiments. Instead, it would be realized by those skilled in the art that various modifications, additions and substitutions may be made to these exemplary embodiments are possible without departing from the principles and spirit of the invention, the scope of which is defined by the accompanying claims.

What is claimed is:

1. A method of preparing a metal oxide dielectric thin film comprising:
   preparing a metal oxide precursor solution by dissolving a metal halide as represented by Formula 1 below, and one or more selected from among a metal alkoxide and an ether compound, in an organic solvent;
   applying the metal oxide precursor solution on a substrate; and
   thermally treating the substrate to thus obtain a thin film:

$$M_aX_b;\quad\text{[Formula 1]}$$

wherein M is a metal of Groups 1 to 14; X is a halogen element; a is an integer from 1 to about 3; and b is an integer from 1 to about 10, wherein the thermally treating is conducted through a non-hydrolytic sol-gel process to thus prepare a metal oxide represented by Formula 4 below:

$$M_xO_y;\quad\text{[Formula 4]}$$

wherein M is a metal of Groups 1 to 14; x is 1 or 2; and y is greater than or equal to 1 and less than or equal to 10.

2. The method of claim 1, wherein the metal is selected from the group consisting of titanium, zirconium, hafnium, aluminum, tantalum, and silicon.

3. The method of claim 1, wherein the metal alkoxide is represented by Formula 2:

$$M_a(OR_1)_n;\quad\text{[Formula 2]}$$

wherein M is a metal of Groups 1 to 14; a is an integer from 1 to 3; $R_1$ is a hydrogen atom, a $C_{1-10}$ alkyl group, a $C_{3-10}$ cycloalkyl group, a $C_{6-15}$ aryl group, a $C_{2-30}$ acryloyl group, a $C_{1-10}$ acryloyloxy group, a $C_{1-10}$ epoxy-substituted alkyl group or cycloalkyl group, a $C_{1-10}$ vinyl group, a $C_{1-10}$ alkyl group, a $C_{1-10}$ epoxy group, or a $C_{1-10}$ alkoxy group; and n is an integer from 1 to about 6.

4. The method of claim 1, wherein the ether compound is represented by Formula 3:

$$R_2OR_1;\quad\text{[Formula 3]}$$

wherein $R_1$ and $R_2$ are each independently a hydrogen atom, a $C_{1-10}$ alkyl group, a $C_{3-10}$ cycloalkyl group, a $C_{6-15}$ aryl group, a $C_{2-30}$ acryloyl group, a $C_{1-10}$ acryloyloxy group, a $C_{1-10}$ epoxy-substituted alkyl group or $C_{1-10}$ cycloalkyl group, a $C_{1-10}$ vinyl group, a $C_{1-10}$ alkyl group, a $C_{1-10}$ epoxy group, or a $C_{1-10}$ alkoxy group.

5. The method of claim 1, wherein the organic solvent is selected from the group consisting of an aliphatic hydrocarbon solvent, an aromatic hydrocarbon solvent, a ketone-based solvent, an ether-based solvent, an acetate-based solvent, an alcohol-based solvent, an amide-based solvent, a silicon-based solvent, and a combination comprising at least one of the foregoing solvents.

6. The method of claim 5, wherein the organic solvent is 2-methoxy ethanol or di(propylene glycol)methyl ether.

7. The method of claim 1, wherein the metal oxide precursor solution comprises:
   about 0.1 to about 50 wt % of the metal oxide precursor based upon the total weight of the solution; and
   about 0.1 to about 50 wt % of the one or more selected from among a metal alkoxide and an ether compound, based upon the total weight of the composition; and
   the organic solvent.

8. The method of claim 1, wherein the applying of the metal oxide precursor solution is conducted using a coating process selected from the group consisting of spin coating, dip coating, roll coating, screen coating, spray coating, spin casting, flow coating, screen printing, ink jetting, drop casting, and one or more of the foregoing coating processes.

9. The method of claim 1, wherein the substrate comprises one or more of the group consisting of glass, a silicon wafer, polyethylene terephthalate, polycarbonate, polyethersulfone, polyethylene naphthalate, and a combination of one or more of the foregoing substrates 10. The method of claim 1, wherein the thermally treating is conducted by baking the substrate and then curing it.

11. The method of claim 10, wherein the baking is conducted at a temperature ranging from about 50° C. to about 250° C., for a period of time ranging from about 1 second to about 1 hour, in an atmosphere selected from the group consisting of a nitrogen atmosphere, an ambient atmosphere, and a vacuum atmosphere.

12. The method of claim 10, wherein the curing is conducted at a temperature ranging from about 100° C. to about 1000° C. for a period of time ranging from about 10 min to about 3 hours in an atmosphere selected from the group consisting of a nitrogen atmosphere, an ambient atmosphere, and a vacuum atmosphere.

13. The method of claim 1, wherein the ether compound is represented by Formula 3:

$$R_2OR_1;\quad\text{[Formula 3]}$$

wherein $R_1$ and $R_2$ are each independently a hydrogen atom, a $C_{1-10}$ alkyl group, a $C_{3-10}$ cycloalkyl group, a $C_{6-15}$ aryl group, a $C_{2-30}$ acryloyl group, a $C_{1-10}$ acryloyloxy group, a $C_{1-10}$ epoxy-substituted alkyl group or $C_{1-10}$ cycloalkyl group, a $C_{1-10}$ vinyl group, a $C_{1-10}$ alkyl group, a $C_{1-10}$ epoxy group, or a $C_{1-10}$ alkoxy group.

14. A method of preparing a metal oxide dielectric thin film comprising:
   preparing a metal oxide precursor solution by dissolving a metal halide as represented by Formula 1 below, and an ether compound, in an organic solvent;
   applying the metal oxide precursor solution on a substrate; and
   thermally treating the substrate to thus obtain a thin film:

$$M_aX_b;\quad\text{[Formula 1]}$$

wherein M is a metal of Groups 1 to 14; X is a halogen element; a is an integer from 1 to about 3; and b is an integer from 1 to about 10.

* * * * *